US011410907B2

(12) United States Patent
Sato (10) Patent No.: US 11,410,907 B2
(45) Date of Patent: Aug. 9, 2022

(54) SEMICONDUCTOR MODULE (71) Applicant: FUJI ELECTRIC CO., LTD., Kawasaki (JP)

(72) Inventor: Tadahiko Sato, Kawasaki (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 17/216,810

(22) Filed: Mar. 30, 2021

(65) Prior Publication Data

US 2021/0358830 A1 Nov. 18, 2021

(30) Foreign Application Priority Data

May 13, 2020 (JP) .............................. JP2020-084420

(51) Int. Cl.
*H01L 23/00* (2006.01)
*H01L 23/373* (2006.01)
*H01L 25/07* (2006.01)
*H01L 23/31* (2006.01)

(52) U.S. Cl.
CPC ...... *H01L 23/3735* (2013.01); *H01L 23/3121* (2013.01); *H01L 24/32* (2013.01); *H01L 24/48* (2013.01); *H01L 24/73* (2013.01); *H01L 25/072* (2013.01); *H01L 2224/32225* (2013.01); *H01L 2224/48225* (2013.01); *H01L 2224/73265* (2013.01); *H01L 2924/1033* (2013.01); *H01L 2924/10253* (2013.01); *H01L 2924/10272* (2013.01); *H01L 2924/1203* (2013.01);
(Continued)

(58) Field of Classification Search
CPC . H01L 2224/49113; H01L 2224/49175; H01L 2224/73221; H01L 2224/83801; H01L 2924/1305; H01L 2924/181; H01L 2924/19107; H01L 23/5386
See application file for complete search history.

(56) References Cited

U.S. PATENT DOCUMENTS

2016/0294379 A1 10/2016 Hayashiguchi et al.
2019/0295990 A1 9/2019 Hayashi et al.
2020/0185359 A1 6/2020 Nakashima et al.

FOREIGN PATENT DOCUMENTS

JP H05-206449 A 8/1993
JP H08-203921 A 8/1996
JP 6650061 B2 2/2020
(Continued)

*Primary Examiner* — Elias Ullah
(74) *Attorney, Agent, or Firm* — Rabin & Berdo, P.C.

(57) ABSTRACT

A semiconductor module includes a multilayer substrate having an insulating plate on which first to third conductive layers respectively connected to positive, negative and output electrode terminals are arranged in a first direction, a plurality of first semiconductor elements each having top and bottom electrodes on the first conductive layer and arranged in a second direction orthogonal to the first direction, a plurality of second semiconductor elements each having top and bottom electrodes on the second conductive layer and arranged in the second direction, first and second main wiring members each connecting the top electrode of each first and second semiconductor element to the second and third conductive layers. The multilayer substrate includes a first control wiring layer extending in the second direction and passing under the first main wiring member, and a second control wiring layer extending in the second direction and passing under the second main wiring member.

11 Claims, 7 Drawing Sheets

(52) U.S. Cl.
CPC ............... *H01L 2924/13055* (2013.01); *H01L 2924/13091* (2013.01); *H01L 2924/15787* (2013.01)

(56) References Cited

FOREIGN PATENT DOCUMENTS

| | | |
|---|---|---|
| WO | 2017/209191 A1 | 12/2017 |
| WO | 2019/044748 A1 | 3/2019 |

SEMICONDUCTOR MODULE

CROSS REFERENCE TO RELATED APPLICATIONS

This application is based upon and claims the benefit of priority of the prior Japanese Patent Application No. 2020-084420, filed on May 13, 2020, the entire contents of which are incorporated herein by reference.

BACKGROUND OF THE INVENTION

Field of the Invention

The present invention relates to a semiconductor module.

Description of the Related Art

Semiconductor devices have a substrate on which semiconductor elements such as an insulated-gate bipolar transistor (IGBT), a power metal-oxide-semiconductor field-effect transistor (power MOSFET), and a free-wheeling diode (FWD) are provided, and are used in apparatuses such as inverters (see the literature referenced below, for example).

In Japanese Patent No. 6650061, an insulating substrate is disposed on the surface of a heatsink, and switching elements are disposed on a predetermined conductor layer of the insulating substrate.

In Japanese Patent Laid-Open No. 8-203921, a drain electrode, a source electrode, a ceramic substrate, and a resin substrate are provided on a metal base.

In International Publication No. WO 2019/044748, a drain pattern, a source pattern, a gate control pattern, and a source control pattern are formed as predetermined circuit patterns on an insulating substrate. A gate wiring pattern is disposed at a position between the drain pattern and the source pattern, for example.

In Japanese Patent Laid-Open No. 5-206449, a second electrode plate and a third electrode plate are disposed on top of a first electrode plate with an insulating plate interposed in between. The electrodes of predetermined semiconductor chips are connected to the second and third electrode plates by wires. For example, the second and third electrode plates are disposed in the center of the module, and the semiconductor chips are disposed on either side.

In International Publication No. WO 2017/209191, a plurality of conductor patterns are formed on the top face of an insulating substrate, and a plurality of switching elements are disposed on predetermined conductor patterns. The gate electrodes and source electrodes of the switching elements are electrically connected to a gate terminal or a source-sense terminal by bonding wires. The gate terminal and the source terminal extend in a predetermined direction so as to pass among the plurality of switching elements.

SUMMARY OF THE INVENTION

In a power semiconductor module in which an upper arm or a lower arm is formed typically by connecting a plurality of power semiconductors in parallel, gate leads and source leads are disposed as control leads separately from the main circuit on a multilayer substrate such as a direct copper bonding (DCB) substrate. On the main circuit, semiconductor elements are disposed to form a desired circuit. The gate leads and source leads are disposed on the outer side of the main circuit, for example.

Also, between the drain (collector)-gate and source electrodes and the auxiliary source electrodes of the semiconductor elements, it is necessary to secure a desired insulation distance between wiring patterns on the substrate in order to satisfy a withstand condition of the semiconductor elements. In the past, a problem is that the multilayer substrate has suffered from an increase in size, which has been entailed to secure this insulation distance.

An object of the present invention, which has been devised in light of such points, is to provide a semiconductor module that can be miniaturized while also securing the insulation distance.

A semiconductor module according to an aspect of the present invention includes: a multilayer substrate formed by arranging a first conductive layer connected to a positive electrode terminal, a second conductive layer connected to an output terminal, and a third conductive layer connected to a negative electrode terminal in a predetermined direction on a top face of an insulating plate; a plurality of first semiconductor elements having a top electrode and a bottom electrode, and disposed on a top face of the first conductive layer with the bottom electrode conductively connected to the first conductive layer; a plurality of second semiconductor elements having a top electrode and a bottom electrode, and disposed on a top face of the second conductive layer with the bottom electrode conductively connected to the second conductive layer; a first main wiring member that connects the top electrode of each of the first semiconductor elements to the second conductive layer; and a second main wiring member that connects the top electrode of each of the second semiconductor elements to the third conductive layer, wherein the first semiconductor elements and the second semiconductor elements are each arranged in a direction intersecting the predetermined direction, and the multilayer substrate includes a first control wiring layer disposed extending in the arrangement direction of the plurality of first semiconductor elements, and passing under the first main wiring member, and a second control wiring layer disposed extending in the arrangement direction of the plurality of second semiconductor elements, and passing under the second main wiring member.

According to the present invention, miniaturization is possible while also securing the insulation distance.

DETAILED DESCRIPTION OF THE PREFERRED EMBODIMENTS

Figure 1:
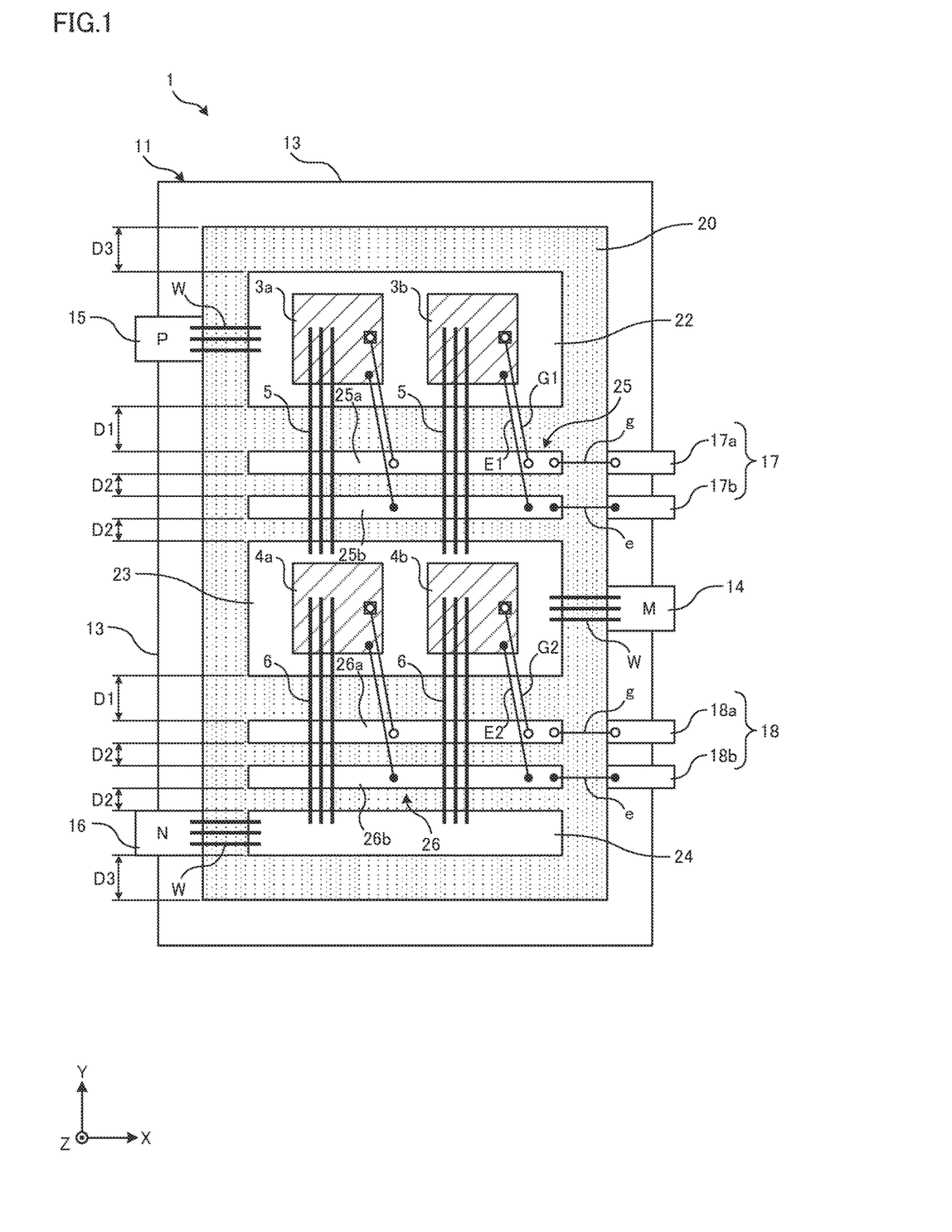
FIG. 1 is a plan view of a semiconductor module according to a first embodiment.

Hereinafter, a semiconductor module capable of applying the present invention will be described. FIG. 1 is a plan view of a semiconductor module according to a first embodiment.

Figure 2:
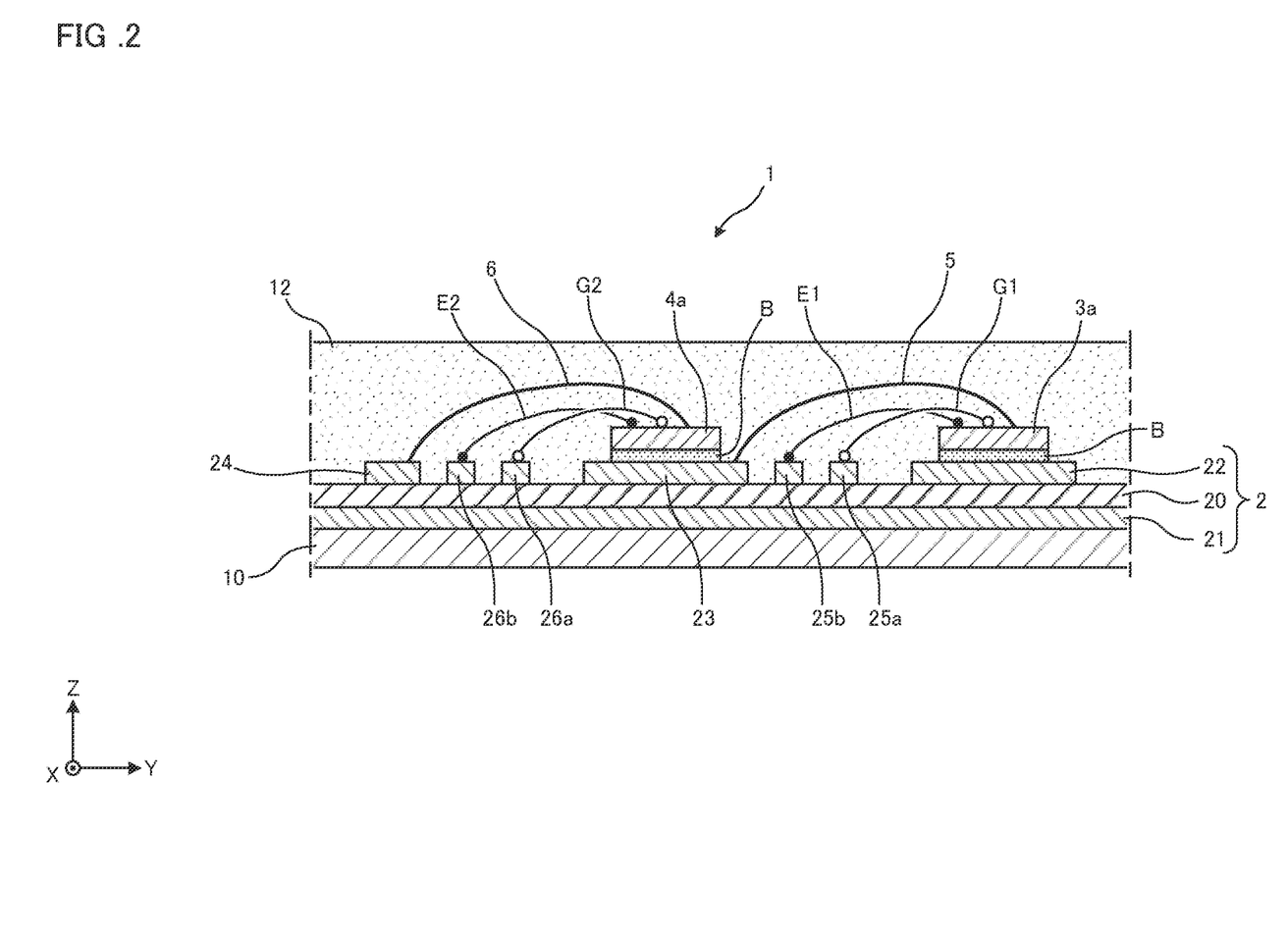
FIG. 2 is a cross-section taken in the YZ plane of the semiconductor module illustrated in FIG. 1.

FIG. 2 is a cross-section taken in the YZ plane of the semiconductor module illustrated in FIG. 1. Note that the semiconductor module illustrated below is merely one non-limiting example, and may be modified appropriately. Also, in the following diagrams, the ends of gate leads are denoted with a hollow circle (○), while the ends of auxiliary leads are denoted with a filled circle (●). Note that in this specification, the term "emitter" may also be substituted with the term "source", and the term "collector" may also be substituted with the term "drain". These terms may be selected depending on the types of semiconductor elements applied to the module.

Also, in the following diagrams, the direction in which a plurality of semiconductor modules is arranged (or the direction in which a plurality of semiconductor elements on the same arm are arranged) is defined as the X direction, the direction in which the upper arm and the lower arm connected in series are arranged is defined as the Y direction, and the height direction (the thickness direction of the substrate) is defined as the Z direction. The illustrated X, Y, and Z axes are orthogonal to each other and constitute a right-handed coordinate system. Additionally, in some cases, the X direction may be referred to as the transverse direction, the Y direction as the longitudinal direction, and the Z direction as the vertical direction. These directions (transverse, longitudinal, and vertical directions) are terms used for convenience in the description, and depending on the installed attitude of the semiconductor module, the correspondence relationships between these directions and the XYZ directions may change. For example, the surface on the heat-dissipating side (cooler side) of the semiconductor module is referred to as the bottom face, while the opposite side is referred to as the top face. Also, in this specification, a plan view means the case of viewing the top face of the semiconductor module from the positive Z direction.

The semiconductor module according to this embodiment is applied to a power conversion device such as a power module, for example, and is a power module that forms an inverter circuit. FIG. 1 will be referenced to describe a single semiconductor module 1. The semiconductor module 1 may include a half-bridge circuit. For example, in the case where the semiconductor module forms a three-phase inverter circuit, three semiconductor modules like that of FIG. 1 are arranged in the X direction in the order of U phase, V phase, W phase.

As illustrated in FIGS. 1 and 2, the semiconductor module 1 includes a base plate 10, a multilayer substrate 2 disposed on top of the base plate 10, a plurality of semiconductor elements disposed on top of the multilayer substrate 2, a case member 11 that houses the multilayer substrate 2 and the semiconductor elements, and an encapsulating resin 12 that fills the case member 11.

The base plate 10 is a rectangular plate having a top face and a bottom face. The base plate 10 functions as a support plate with favorable thermal conductivity. Additionally, the base plate 10 has a rectangular shape in a plan view that is long in the X direction. The base plate 10 is a metal plate containing copper, aluminum, or an alloy thereof, for example. The surface of the base plate 10 may also be plated.

The case member 11 having a rectangular frame shape in a plan view is disposed on the top face of the base plate 10. The case member 11 is formed with plastic for example, and is bonded to the top face of the base plate 10 by an adhesive (not illustrated). The case member 11 has a shape that follows the outline of the base plate 10, and a frame is formed by a pair of side walls 13 that face opposite each other in the X direction and a pair of side walls 13 that face opposite each other in the Y direction connected to each other at the four corners. The case member 11 demarcates a space that houses the multilayer substrate 2, the semiconductor elements, and the encapsulating resin 12.

The pairs of side walls 13 that face opposite each other in the X and Y directions are flat on top. In the pair of side walls 13 that face opposite each other in the X direction, an output terminal 14 (M terminal) that acts as a case terminal is provided on the positive X side, while a positive electrode terminal 15 (P terminal) and a negative electrode terminal 16 (N terminal) are provided as case terminals on the negative X side.

The output terminal 14 is positioned substantially centrally in the Y direction of one of the side walls 13. Although described in detail later, the output terminal 14 is disposed between a first control terminal 17 on the upper arm side and a second control terminal 18 on the lower arm side. The positive electrode terminal 15 is disposed off-center on the positive Y side of one of the side walls 13. The negative electrode terminal 16 is disposed off-center on the negative Y side of one of the side walls 13. These case terminals form external connection terminals for the main current, and are formed by press working or the like using a metal material such as a copper material, a copper alloy material, an aluminum alloy material, or an iron alloy material, for example.

Also, the first control terminal 17 and the second control terminal 18 for external connection are disposed on the side wall 13 positioned on the positive Y side from among the pair of side walls 13 that face opposite each other in the Y direction. The first control terminal 17 and the second control terminal 18 are arranged in the Y direction with the output terminal disposed in between. The first control terminal 17 is positioned on the positive Y side, while the second control terminal 18 is positioned on the negative Y side.

The first control terminal 17 forms a portion of the upper arm described later, and has ends arranged in two columns in the Y direction. Specifically, the first control terminal 17 includes a first gate terminal 17a positioned on the positive Y side and a first auxiliary terminal 17b positioned on the negative Y side. On the other hand, the second control terminal 18 forms a portion of the lower arm described later, and has ends arranged in two columns in the Y direction. Specifically, the second control terminal 18 includes a second gate terminal 18a positioned on the positive Y side and a second auxiliary terminal 18b positioned on the negative Y side.

The first control terminal 17 and the second control terminal 18 are embedded in the side wall 13 by solid casting. The respective ends of the first control terminal 17 and the second control terminal 18 are disposed so as to be exposed on the top face of the side wall 13. The first control terminal 17 and the second control terminal 18 are formed by a process such as bending a plate-shaped body of a metal material such as a copper material, a copper alloy material, an aluminum alloy material, or an iron alloy material, for example. Although described in detail later, wiring members for control are connected to the respective ends of the first control terminal 17 and the second control terminal 18.

Also, on the inner side of the case member 11, the multilayer substrate 2 is disposed on the top face of the base plate 10. The multilayer substrate 2 is formed by stacking metal layers and insulating layers, and includes a direct copper bonding (DCB) substrate, an active metal brazing (AMB) substrate, or a metal base substrate, for example. Specifically, the multilayer substrate 2 includes an insulating plate 20, a heatsink 21 disposed on the bottom face of the insulating plate 20, and a plurality of circuit boards disposed on the top face of the insulating plate 20. The multilayer substrate 2 is formed into a rectangular shape in a plan view, for example.

The insulating plate 20 has a predetermined thickness in the Z direction, and is formed into a tabular shape having a top face and a bottom face. The insulating plate 20 is formed by a ceramic material such as alumina ($Al_2O_3$), aluminum nitride (AlN), or silicon nitride ($Si_3N_4$), a resin material such as epoxy, or an insulating material such as an epoxy resin using a ceramic material as a filler, for example. Note that the insulating plate 20 may also be referred to as an insulating layer or an insulating film.

The heatsink 21 has a predetermined thickness in the Z direction, and is formed so as to cover the entire bottom face of the insulating plate 20. The heatsink 21 is formed by a metal plate with favorable thermal conductivity, such as copper or aluminum, for example.

On the top face (main surface) of the insulating plate 20, the plurality of circuit boards are formed as independent islands that are electrically insulated from each other. The plurality of circuit boards contain a metal layer of predetermined thickness formed by copper foil or the like, and are roughly divided into a main wiring layer and a control wiring layer. The main wiring layer includes a first conductive layer 22 connected to the positive electrode terminal 15, a second conductive layer 23 connected to the output terminal 14, and a third conductive layer 24 connected to the negative electrode terminal 16. The control wiring layer includes a first control wiring layer 25 and a second control wiring layer 26.

The first conductive layer 22, the second conductive layer 23, and the third conductive layer 24 have a rectangular shape in a plan view that is long in the X direction. The first conductive layer 22, the second conductive layer 23, and the third conductive layer 24 are arranged in a predetermined direction, namely the Y direction, on the top face of the insulating plate 20. The first conductive layer 22 is disposed off-center on the positive Y side, while the third conductive layer 24 is disposed off-center on the negative Y side. The second conductive layer 23 is disposed substantially centrally in the Y direction of the insulating plate 20, between the first conductive layer 22 and the third conductive layer 24.

The first control wiring layer 25 is disposed between the first conductive layer 22 and the second conductive layer 23. The first control wiring layer 25 includes a first gate wiring layer 25a and a first auxiliary wiring layer 25b. The first gate wiring layer 25a and the first auxiliary wiring layer 25b each have an elongated shape in a plan view that is long in the X direction. The first gate wiring layer 25a and the first auxiliary wiring layer 25b are arranged in the Y direction. Specifically, the first gate wiring layer 25a is positioned on the positive Y side, and the first auxiliary wiring layer 25b is positioned on the negative Y side. In other words, the first gate wiring layer 25a is disposed nearer to the first conductive layer 22 side, while the first auxiliary wiring layer 25b is disposed nearer to the second conductive layer 23 side. The first conductive layer 22, the first gate wiring layer 25a, the first auxiliary wiring layer 25b, and the second conductive layer 23 may be disposed in that order in the Y direction.

The second control wiring layer 26 is disposed between the second conductive layer 23 and the third conductive layer 24. The second control wiring layer 26 includes a second gate wiring layer 26a and a second auxiliary wiring layer 26b. The second gate wiring layer 26a and the second auxiliary wiring layer 26b each have an elongated shape in a plan view that is long in the X direction. The second gate wiring layer 26a and the second auxiliary wiring layer 26b are arranged in the Y direction. Specifically, the second gate wiring layer 26a is positioned on the positive Y side, and the second auxiliary wiring layer 26b is positioned on the negative Y side. In other words, the second gate wiring layer 26a is disposed nearer to the second conductive layer 23 side, while the second auxiliary wiring layer 26b is disposed nearer to the third conductive layer 24 side. The second conductive layer 23, the second gate wiring layer 26a, the second auxiliary wiring layer 26b, and the third conductive layer 24 may be disposed in that order in the Y direction.

A plurality of semiconductor elements are disposed through a bonding material B such as solder on the top face of the predetermined circuit boards that form the main wiring layer. With this arrangement, a bottom electrode of each of the semiconductor elements is conductively connected to the main wiring layer. The semiconductor elements are formed having a square shape in a plan view by a semiconductor substrate such as silicon (Si), silicon carbide (SiC), or gallium nitride (GaN), for example. In this embodiment, the semiconductor elements are reverse-conducting IGBT (RC-IGBT) elements combining the functions of an IGBT element and a FWD element, or power MOSFET elements.

Note that the semiconductor elements are not limited to the above, and may also be a combination of a switching element such as an IGBT, a power MOSFET, or a bipolar junction transistor (BJT) and a diode such as a FWD. Also, an element such as a reverse-blocking IGBT (RB-IGBT) having a sufficient withstand voltage with respect to reverse bias may also be used as the semiconductor elements. Also, properties such as the shape, number, and placement of the semiconductor elements may be changed appropriately. Note that the semiconductor elements according to this embodiment are vertical switching elements in which a functional element such as a transistor is formed on a semiconductor substrate.

Each semiconductor element has a top electrode and a bottom electrode. The top electrode may also be referred to as the emitter electrode, the source electrode, or the main electrode. The bottom electrode may also be referred to as the collector electrode, the drain electrode, or the main electrode. Also, in each semiconductor element, a gate electrode that acts as a control electrode is disposed off-center near the perimeter of the top face. In other words, the gate electrode is disposed off-center near an edge of each semiconductor element. In each semiconductor element, an auxiliary electrode for gate driving connected to the top electrode is provided beside the gate electrode. The auxiliary electrode may be referred to as the driving source electrode in the case where the semiconductor element is a MOSFET, and may be referred to as the driving emitter electrode in the case of an IGBT.

In this embodiment, four semiconductor elements are disposed for a single phase. Specifically, in this embodiment, two first semiconductor elements 3a and 3b are disposed on the top face of the first conductive layer 22, and two second semiconductor elements 4a and 4b are disposed on the top face of the second conductive layer 23. The two first semiconductor elements 3a and 3b are arranged in the X direction intersecting the Y direction. Similarly, the two second semiconductor elements 4a and 4b are arranged in the X direction. These four semiconductor elements are arranged such that the gate electrodes face the same direction. In FIG. 1, each gate electrode is disposed in the middle of the edge on the positive X side.

The upper arm is formed by the first semiconductor elements 3a and 3b, the first conductive layer 22, and the first control wiring layer 25. Similarly, the lower arm is formed by the second semiconductor elements 4a and 4b, the second conductive layer 23, and the second control wiring layer 26. The upper arm and the lower arm are arranged in the Y direction.

The top electrodes of the first semiconductor elements 3a and 3b and the second conductive layer 23 are electrically connected by a first main wiring member 5. The top electrodes of the second semiconductor elements 4a and 4b and the third conductive layer 24 are electrically connected by a second main wiring member 6. The positive electrode terminal 15 and the first conductive layer 22, the output terminal 14 and the second conductive layer 23, and the negative electrode terminal 16 and the third conductive layer 24, respectively, are electrically connected by a wiring member W.

Conductor wires (bonding wires) are used as these wiring members. Gold, copper, aluminum, gold alloy, copper alloy, and aluminum alloy can be used either singly or in combination with each other as the material of the conductor wires. Additionally, it is also possible to use members other than conductor wires as the wiring members. For example, ribbons can be used as the wiring members. Furthermore, the wiring members are not limited to wires or the like, and may also be formed by a metal plate such as a copper material, a copper alloy material, an aluminum alloy material, or an iron alloy material, for example.

The first main wiring member 5 extends in the Y direction and forms an arch so as to straddle over the first control wiring layer 25. The first main wiring member 5 and the first control wiring layer 25 are disposed so as to intersect each other. Similarly, the second main wiring member 6 extends in the Y direction and forms an arch so as to straddle over the second control wiring layer 26. The second main wiring member 6 and the second control wiring layer 26 are disposed so as to intersect each other.

The gate electrode of each of the first semiconductor elements 3a and 3b is electrically connected to the first gate wiring layer 25a through a first gate wiring member G1. The auxiliary electrode of each of the first semiconductor elements 3a and 3b is electrically connected to the first auxiliary wiring layer 25b through a first auxiliary wiring member E1. The first gate wiring member G1 and the first auxiliary wiring member E1 extend in a direction intersecting the X direction, and are inclined slightly in the Y direction in a plan view, for example. Also, the positive X end of the first gate wiring layer 25a and the first gate terminal 17a are electrically connected by a gate wiring member g. The positive X end of the first auxiliary wiring layer 25b and the first auxiliary terminal 17b are electrically connected by an auxiliary wiring member e.

The gate electrode of each of the second semiconductor elements 4a and 4b is electrically connected to the second gate wiring layer 26a through a second gate wiring member G2. The auxiliary electrode of each of the second semiconductor elements 4a and 4b is electrically connected to the second auxiliary wiring layer 26b through a second auxiliary wiring member E2. The second gate wiring member G2 and the second auxiliary wiring member E2 extend in a direction intersecting the X direction, and are inclined slightly in the Y direction in a plan view, for example. Also, the positive X end of the second gate wiring layer 26a and the second gate terminal 18a are electrically connected by the gate wiring member g. The positive X end of the second auxiliary wiring layer 26b and the second auxiliary terminal 18b are electrically connected by the auxiliary wiring member e.

Conductor wires (bonding wires) are used as these wiring members. Gold, copper, aluminum, gold alloy, copper alloy, and aluminum alloy can be used either singly or in combination with each other as the material of the conductor wires. Additionally, it is also possible to use members other than conductor wires as the wiring members. For example, ribbons can be used as the wiring members.

Meanwhile, in a semiconductor module, there is a demand to secure a clearance (insulation distance) between a plurality of circuit boards (wiring layers) formed on an insulating plate according to the voltage needed. For example, the needed clearance changes depending on the potential difference between adjacent circuit boards. Because of such restraints on the layout of the circuit boards, there is also a possibility that the drawing-out of wiring members such as wires will also be affected. For example, because wires of narrower gauge than the main wiring is adopted as the wiring for control signals, if the wiring is lengthened, there is a risk of disconnection due to factors such as vibration and thermal stress.

Figure 3:
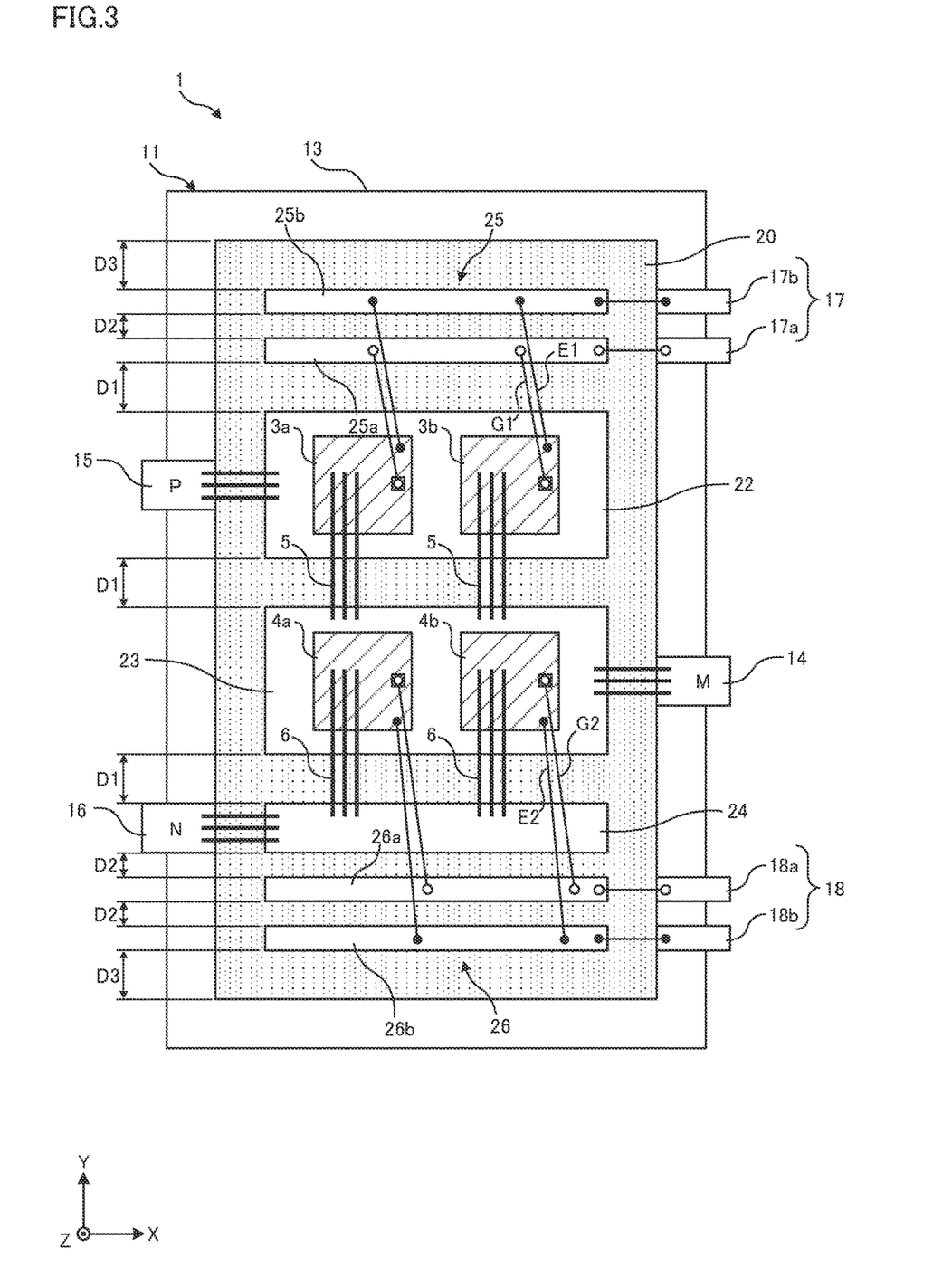
FIG. 3 is a plan view of a semiconductor module according to a reference example.

Accordingly, the inventor focused on the layout of a portion of the control wiring layer among the plurality of circuit boards, and conceived of the present invention. Here, the features of a semiconductor module according to this embodiment will be described in comparison to a reference example in FIG. 3. FIG. 3 is a plan view of a semiconductor module according to a reference example. FIG. 3 differs from the configuration in FIGS. 1 and 2 in that the layout of the control wiring layer is different. Consequently, the differences will be described mainly, and portions of the configuration that have already been described will be omitted from further description where appropriate. Reference signs are also omitted from the drawings where appropriate.

As illustrated in FIG. 3, in the reference example, the first control wiring layer 25 is positioned farther on the positive Y side than the first conductive layer 22, and the second control wiring layer 26 is positioned farther on the negative Y side than the third conductive layer 24. Consequently, the second gate wiring member G2 and the second auxiliary wiring member E2 are disposed straddling the third conductive layer 24, and the wiring length is increased.

Here, let a high potential difference clearance D1 (hereinafter, D1) be the clearance between a main wiring layer and a control wiring layer disposed adjacently, or the clearance between main wiring elements in which a relatively high potential difference occurs between the main wiring layers disposed adjacently. Also, let a low potential difference clearance D2 (hereinafter, D2) be the clearance between control wiring layers disposed adjacently, or the clearance between a main wiring layer and a control wiring layer in which a relatively low potential difference occurs between a main wiring layer and a control wiring layer disposed adjacently. In addition, let D3 be the clearance between the periphery of the multilayer substrate 2 and an adjacent wiring layer. D1 is wider than D2. In FIG. 3, D1 exists in three locations, D2 exists in three locations, and D3 exists in two locations.

In this embodiment, as illustrated in FIG. 1, the first control wiring layer 25 is disposed extending in the arrangement direction of the plurality of first semiconductor elements 3a and 3b, and passing under the first main wiring member 5. Similarly, the second control wiring layer 26 is disposed extending in the arrangement direction of the plurality of second semiconductor elements 4a and 4b, and passing under the second main wiring member 6.

More specifically, the first control wiring layer 25 includes the first gate wiring layer 25a connected to the gate electrodes of the first semiconductor elements 3a and 3b through the first gate wiring member G1, and the first auxiliary wiring layer 25b connected to the top electrodes of the first semiconductor elements 3a and 3b through the first auxiliary wiring member E1. Also, the second control wiring layer 26 includes the second gate wiring layer 26a connected to the gate electrodes of the second semiconductor elements 4a and 4b through the second gate wiring member G2, and the second auxiliary wiring layer 26b connected to the top electrodes of the second semiconductor elements 4a and 4b through the second auxiliary wiring member E2.

In the Y direction, the clearance D2 between the first auxiliary wiring layer 25b and the second conductive layer 23 may be narrower than the clearance D1 between the first conductive layer 22 and the first gate wiring layer 25a. The clearance D2 between the second auxiliary wiring layer 26b and the third conductive layer 24 may be narrower than the clearance D1 between the second conductive layer 23 and the second gate wiring layer 26a. By reducing the gap between circuit boards of the same potential, the semiconductor module 1 can be miniaturized.

Also, the first conductive layer 22, the first gate wiring layer 25a, the first auxiliary wiring layer 25b, and the second conductive layer 23 may be provided such that the respective gaps therebetween are successively smaller. The second conductive layer 23, the second gate wiring layer 26a, the second auxiliary wiring layer 26b, and the third conductive layer 24 may be provided such that the respective gaps therebetween are successively smaller. By reducing the gap between circuit boards having a low potential difference, the semiconductor module 1 likewise can be miniaturized.

Also, the gap between the first conductive layer 22 and the first gate wiring layer 25a and the gap between the second conductive layer 23 and the second gate wiring layer 26a may be the same or different. The gap between the first auxiliary wiring layer 25b and the second conductive layer 23 and the gap between the second auxiliary wiring layer 26b and the third conductive layer 24 may be the same or different.

By adopting such a layout, in FIG. 1, D1 exists in two locations, D2 exists in four locations, and D3 exists in two locations. In other words, compared to FIG. 3, FIG. 1 has one fewer D1 and one more D2, in which D1 is wider than D2. Consequently, miniaturization of the entire module in the Y direction is possible while also securing the desired insulation distance. Also, in the lower arm, the second gate wiring member G2 and the second auxiliary wiring member E2 do not straddle the third conductive layer 24, thereby making it possible to shorten the wiring length. As a result, disconnection and the like of the wiring members can be prevented.

Also, in this embodiment, the upper arm is formed by the first conductive layer 22, the first semiconductor elements 3a and 3b, and the first control wiring layer 25, while the lower arm is formed by the second conductive layer 23, the second semiconductor elements 4a and 4b, and the second control wiring layer 26. The upper arm and the lower arm are configured to have the same layout.

Also, in the semiconductor module 1, the positive electrode terminal 15 and the negative electrode terminal 16 are disposed on one end (the negative X end) of the first control wiring layer 25 and the second control wiring layer 26 on the same side. In contrast, the output terminal 14 is disposed on the other end (the positive X end) of the first control wiring layer 25 and the second control wiring layer 26 on the opposite side of the positive electrode terminal 15 and the negative electrode terminal 16. For example, the positive electrode terminal 15 and the negative electrode terminal 16 may be disposed on one of the pair of side walls 13 of the case member 11, while the output terminal 14 may be disposed on the other of the pair.

Also, the first control terminal 17 is disposed on the other end (positive X end) of the first control wiring layer 25, while the second control terminal 18 is disposed on the other end (positive X end) of the second control wiring layer 26. In other words, in the semiconductor module 1, the first control terminal 17 and the second control terminal 18 are disposed on the same side, namely the positive X side.

In this way, by adopting the same layout for the upper arm and the lower arm, the current pathways in the upper and lower arms can be set to the same lengths. As a result, it is possible to eliminate error in switching operations and achieve favorable switching.

Figure 4:
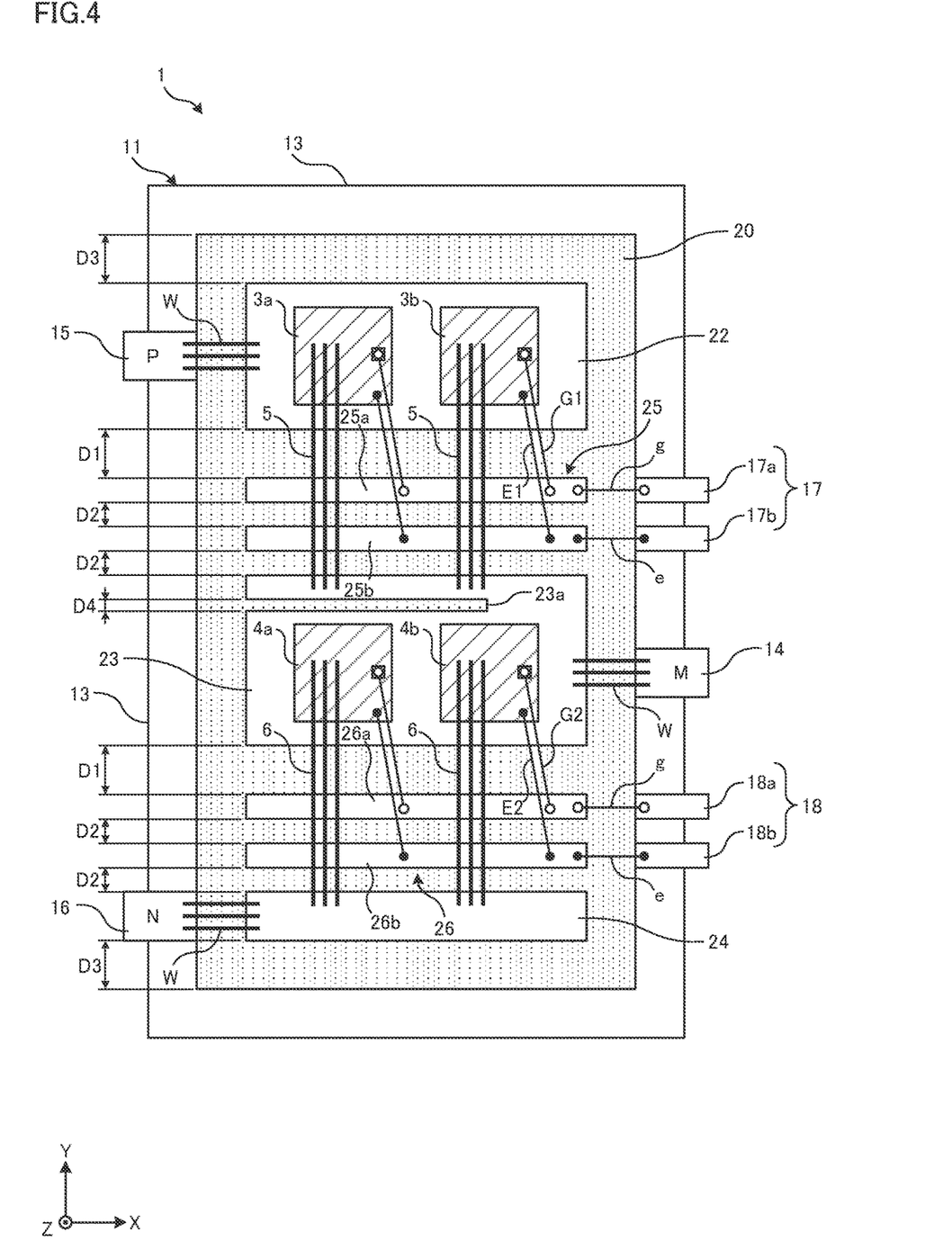
FIG. 4 is a plan view of a semiconductor module according to a second embodiment.
Figure 5:
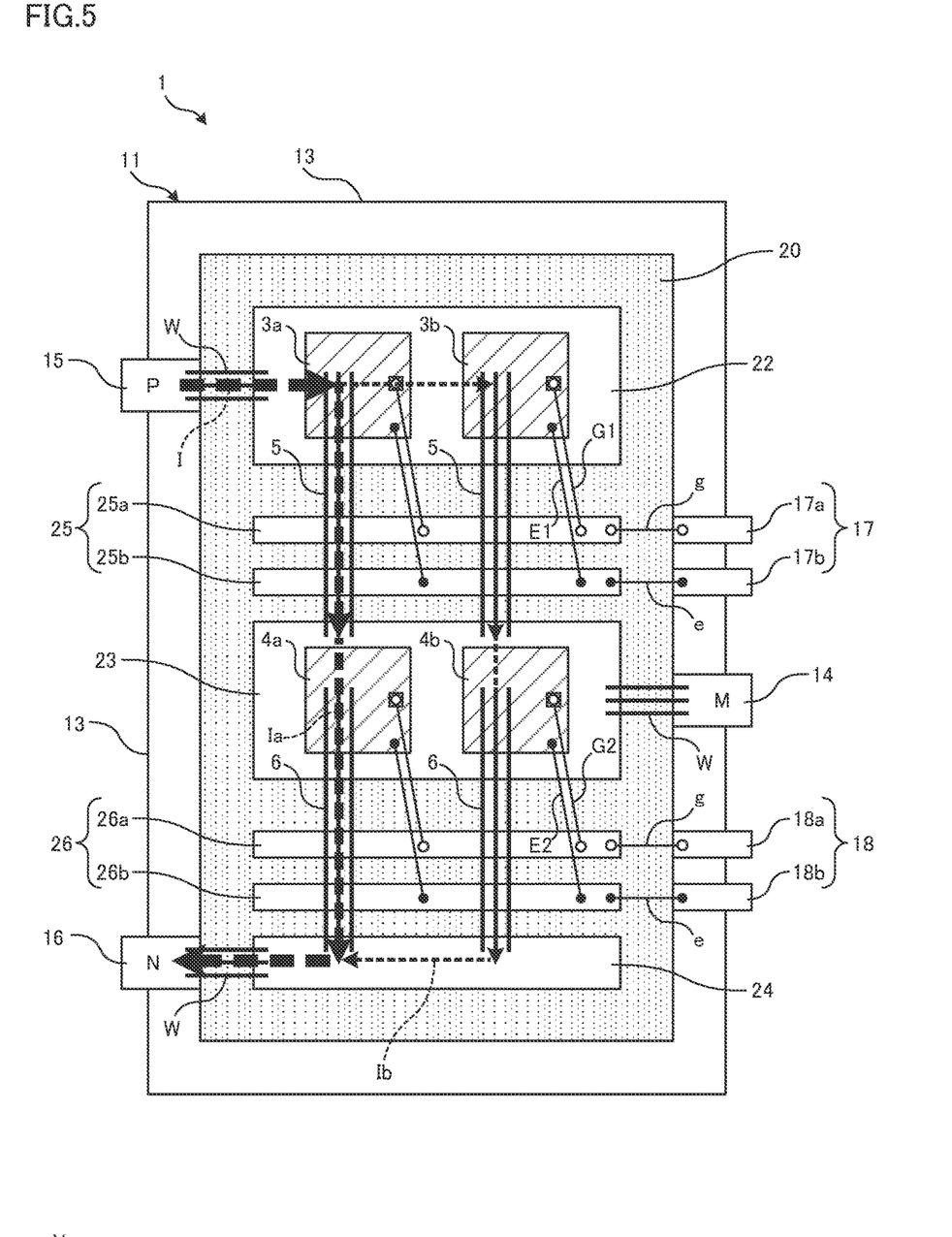
FIG. 5 is a schematic diagram illustrating current pathways in the first embodiment.
Figure 6:
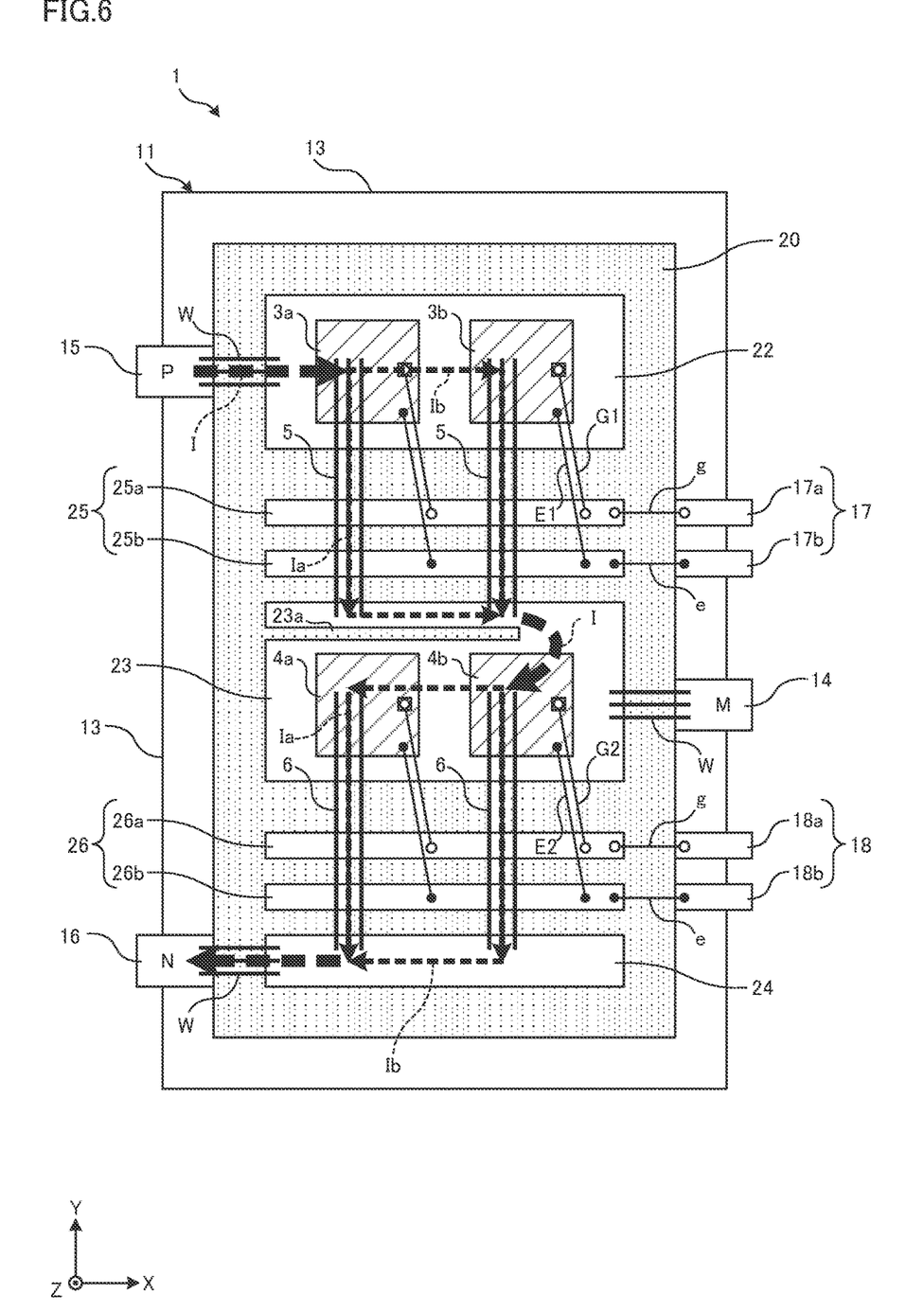
FIG. 6 is a schematic diagram illustrating current pathways in the second embodiment.

Next, a second embodiment will be described with reference to FIGS. 4 to 6. FIG. 4 is a plan view of a semiconductor module according to the second embodiment. FIG. 5 is a schematic diagram illustrating current pathways in the first embodiment. FIG. 6 is a schematic diagram illustrating current pathways in the second embodiment. In the second embodiment, points that differ from the first embodiment will be described mainly, and a description of the portions shared in common with the first embodiment will be omitted where appropriate.

As illustrated in FIG. 4, in the second conductive layer 23 of the second embodiment, the second semiconductor elements 4a and 4b are disposed off-center on the negative Y side. In the second conductive layer 23, a slit 23a of predetermined width is formed farther on the positive Y side than the second semiconductor elements 4a and 4b, and runs from the edge on the negative X side toward the positive X side.

The slit 23a is formed in an elongated shape extending in the X direction. Also, the slit 23a has an open end on the negative X side and a closed end on the positive X side. More specifically, the positive X end of the slit 23a is formed reaching the center in the X direction of the second semiconductor element 4b positioned outermost (near the output terminal 14) of the two second semiconductor elements 4a and 4b. Also, a width D4 of the slit 23a is preferably narrower than D1 to D3 described above. For example, the width D4 of the slit 23a may be narrower than the high potential difference clearance D1 between the second conductive layer 23 and the first control wiring layer 25.

Meanwhile, in the first embodiment described above, when current flows through the module, the current may become biased according to the positions of the semiconductor elements arranged in parallel. As an example, consider the case where current flows from the positive electrode terminal 15 to the negative electrode terminal 16 when the upper arm is turned on.

As illustrated in FIG. 5, let I be the current that flows into the positive electrode terminal 15 and the current that flows out from the negative electrode terminal 16. The current I is split into a current Ia that flows through the first semiconductor element 3a and the second semiconductor element 4a, and a current Ib that flows through the first semiconductor element 3b and the second semiconductor element 4b. In other words, the relationship I=Ia+Ib holds.

At this time, the current Ia tends to become larger than the current Ib. This is because current flows more readily along a relatively shorter current pathway. Specifically, the first semiconductor element 3a and the second semiconductor element 4a are positioned farther on the negative X side than the first semiconductor element 3b and the second semiconductor element 4b, closer to the positive electrode terminal 15 and the negative electrode terminal 16. In other words, the current pathway that flows through the first semiconductor element 3a and the second semiconductor element 4a is shorter than the current pathway that flows through the first semiconductor element 3b and the second semiconductor element 4b.

Accordingly, the inventor conceived of forming the slit 23a in the second conductive layer 23 partway along the current pathway, as illustrated in FIGS. 4 to 6. On the first control wiring layer 25 side, the slit 23a extends in the arrangement direction of the first semiconductor elements 3a and 3b. The slit 23a is open on one end and closed on the other end. According to this slit 23a, a plurality of current pathways that pass through the plurality of first semiconductor elements 3a and 3b and the plurality of second semiconductor elements 4a and 4b are formed having equal path lengths.

More specifically, as illustrated in FIG. 6, in the upper arm, Ia and Ib split respectively between the first semiconductor elements 3a and 3b flow to go around the slit 23a in the second conductive layer 23, and consequently converge at the end on the positive X side of the slit 23a. On the lower arm side, the current splits from the second semiconductor element 4b and re-converges in the third conductive layer 24.

In this way, by providing the slit 23a, current flows along current pathways of equal length in each arm, and therefore a bias between Ia and Ib does not occur. Consequently, current imbalance can be suppressed during recovery, a short, or the like. Also, because the potential is the same everywhere on the second conductive layer 23, the width of the slit 23a can be made as narrow as possible. For this reason, it is possible to achieve miniaturization of the module while also suppressing current imbalance.

As described above, according to the present invention, miniaturization of the entire module in the Y direction is possible while also securing the desired insulation distance.

Figure 7:
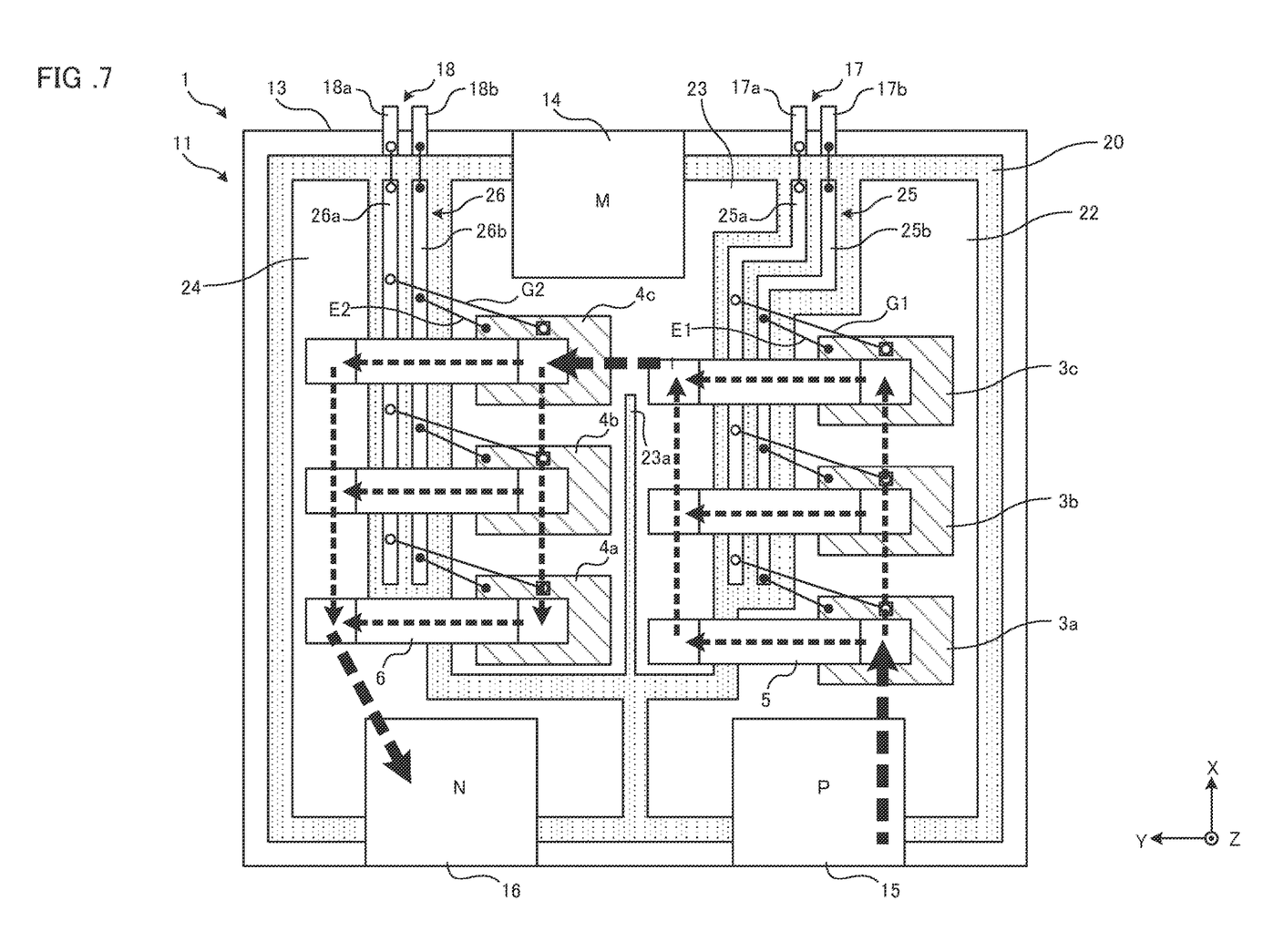
FIG. 7 is a plan view of a semiconductor module according to a modification.

Also, in the above embodiments, the number and placement of the semiconductor elements is not limited to the above configuration and may be changed appropriately. For example, the above example describes a case where the semiconductor elements connected in parallel are disposed two at a time, but the embodiments are not limited to this configuration. For example, the configuration illustrated in FIG. 7 is also possible. FIG. 7 is a plan view of a semiconductor module according to a modification. In FIG. 7, the semiconductor elements connected in parallel are disposed three at a time on the upper and lower arms. Additionally, the positional relationship between the upper arm and the lower arm is the reverse of the second embodiment. Otherwise, the layout of components such as the circuit boards is slightly different, but the configuration already described basically will be denoted with the same signs similar to the above, and a description will be omitted where appropriate. Additionally, the effects are also similar.

As illustrated in FIG. 7, in the modification, the three first semiconductor elements 3a to 3c forming the upper arm are disposed in the X direction in order from the negative X side. Also, the three second semiconductor elements 4a to 4c forming the lower arm are disposed in the X direction in order from the negative X side. Also, in FIG. 7, the first main wiring member 5 and the second main wiring member 6 are formed by a metal plate (also referred to as a lead frame).

In FIG. 7, the end on the positive electrode terminal 15 side of the first control wiring layer 25 is formed reaching the first semiconductor element 3b positioned one element closer to the output terminal 14 side than the first semiconductor element 3a positioned farthest on the positive electrode terminal 15 side from among the plurality of first semiconductor elements 3a to 3c. The end on the positive electrode terminal 15 side of the first control wiring layer 25 may also be provided between the first semiconductor element 3a and the first semiconductor element 3b in the X direction. In other words, the end on the positive electrode terminal 15 side of the first control wiring layer 25 passes under the first main wiring members 5 connected to the first semiconductor elements 3b and 3c, but does not pass under the first main wiring member 5 connected to the first semiconductor element 3a.

Similarly, the end on the positive electrode terminal 15 side of the second control wiring layer 26 is formed reaching the second semiconductor element 4b positioned one element closer to the output terminal 14 side than the second semiconductor element 4a positioned farthest on the positive electrode terminal 15 side from among the plurality of second semiconductor elements 4a to 4c. The end on the positive electrode terminal 15 side of the second control wiring layer 26 may also be provided between the second semiconductor element 4a and the second semiconductor element 4b in the X direction. In other words, the end on the positive electrode terminal 15 side of the second control wiring layer 26 passes under the second main wiring members 6 connected to the second semiconductor elements 4b and 4c, but does not pass under the second main wiring member 6 connected to the second semiconductor element 4a.

According to these configurations, it is possible to secure enough pattern space for the first conductive layer 22 and the third conductive layer 24.

Also, in the above embodiments, the number and layout of circuit boards is not limited to the above configuration and may be changed appropriately.

Also, the above embodiments take a configuration in which the multilayer substrate 2 and the semiconductor elements are formed in a rectangular or square shape in a plan view, but the embodiments are not limited to this configuration. The multilayer substrate 2 and the semiconductor elements may also be formed in a polygonal shape other than the above.

In addition, the embodiments and a modification have been described, but the above embodiments and the modification may also be combined in full or in part and treated as another embodiment.

Also, an embodiment according to the present invention is not limited to the above embodiments and modification, and various other modifications, substitutions, and alterations are possible without departing from the scope of the technical idea. Further, if the technical idea can be achieved according to another method through the advancement of the technology or another derivative technology, the technical idea may be implemented using the method. Consequently, the claims cover all embodiments which may be included in the scope of the technical idea.

Features of the above embodiments are summarized below.

A semiconductor module according to the above embodiments includes: a multilayer substrate formed by arranging a first conductive layer connected to a positive electrode terminal, a second conductive layer connected to an output terminal, and a third conductive layer connected to a negative electrode terminal in a predetermined direction on a top face of an insulating plate; a plurality of first semiconductor elements having a top electrode and a bottom electrode, and disposed on a top face of the first conductive layer with the bottom electrode conductively connected to the first conductive layer; a plurality of second semiconductor elements having a top electrode and a bottom electrode, and disposed on a top face of the second conductive layer with the bottom electrode conductively connected to the second conductive layer; a first main wiring member that connects the top electrode of each of the first semiconductor elements to the second conductive layer; and a second main wiring member that connects the top electrode of each of the second semiconductor elements to the third conductive layer, wherein the first semiconductor elements and the second semiconductor elements are each arranged in a direction intersecting the predetermined direction, and the multilayer substrate includes a first control wiring layer disposed extending in the arrangement direction of the plurality of first semiconductor elements, and passing under the first main wiring member, and a second control wiring layer disposed extending in the arrangement direction of the plurality of second semiconductor elements, and passing under the second main wiring member.

Also, in the above semiconductor module, the first control wiring layer includes a first gate wiring layer connected to a gate electrode of the first semiconductor elements through a first gate wiring member, and a first auxiliary wiring layer connected to the top electrode of the first semiconductor elements through a first auxiliary wiring member, while the second control wiring layer includes a second gate wiring layer connected to a gate electrode of the second semiconductor elements through a second gate wiring member, and a second auxiliary wiring layer connected to the top electrode of the second semiconductor elements through a second auxiliary wiring member.

Also, in the above semiconductor module, the second conductive layer has a slit extending in the arrangement direction of the first semiconductor elements on the first control wiring layer side, and the slit is open on one end and closed on another end.

Also, in the above semiconductor module, a plurality of current pathways of equal length passing through the plurality of first semiconductor elements and the plurality of second semiconductor elements are formed by the slit.

Also, in the above semiconductor module, the other end of the slit is formed reaching the second semiconductor element positioned outermost among the plurality of second semiconductor elements.

Also, in the above semiconductor module, the width of the slit is narrower than a gap between the second conductive layer and the first control wiring layer.

Also, in the above semiconductor module, an upper arm is formed by the first conductive layer, the first semiconductor elements, and the first control wiring layer, a lower arm is formed by the second conductive layer, the second semiconductor elements, and the second control wiring layer, and the upper arm and the lower arm have the same layout.

Also, in the above semiconductor module, the positive electrode terminal and the negative electrode terminal are disposed on one end of the first control wiring layer and the second control wiring layer on the same side, and the output terminal is disposed on the other end of the first control wiring layer and the second control wiring layer on the opposite side from the positive electrode terminal and the negative electrode terminal.

Also, in the above semiconductor module, an end on the positive electrode terminal side of the first control wiring layer is formed reaching the first semiconductor element positioned one element closer to the output terminal side than the first semiconductor element positioned farthest on the positive electrode terminal side from among the plurality of first semiconductor elements, and an end on the negative electrode terminal side of the second control wiring layer is formed reaching the second semiconductor element positioned one element closer to the output terminal side than the second semiconductor element positioned farthest on the negative electrode terminal side from among the plurality of second semiconductor elements.

Also, the above semiconductor module further includes: a first control terminal disposed on the other end of the first control wiring layer and connected to the first control wiring layer; and a second control terminal disposed on the other end of the second control wiring layer and connected to the second control wiring layer, wherein the first control terminal and the second control terminal are disposed on the same side.

Also, in the above semiconductor module, the first main wiring member and the second main wiring member contain a wire or a metal plate having an arched shape extending in the predetermined direction, the first main wiring member and the first control wiring layer are disposed so as to intersect, and the second main wiring member and the second control wiring layer are disposed so as to intersect.

As described above, the present invention has an effect of enabling miniaturization while also securing the insulation distance, and is particularly useful in a semiconductor module.

REFERENCE SIGNS LIST

1: semiconductor module
2: multilayer substrate
3a: first semiconductor element
3b: first semiconductor element
3c: first semiconductor element
4a: second semiconductor element
4b: second semiconductor element
4c: second semiconductor element
5: first main wiring member
6: second main wiring member
10: base plate
11: case member
12: encapsulating resin
13: side wall
14: output terminal
15: positive electrode terminal
16: negative electrode terminal
17: first control terminal
17a: first gate terminal
17b: first auxiliary terminal
18: second control terminal
18a: second gate terminal
18b: second auxiliary terminal
20: insulating plate
21: heatsink
22: first conductive layer
23: second conductive layer
23a: slit
24: third conductive layer 25: first control wiring layer
25a: first gate wiring layer
25b: first auxiliary wiring layer
26: second control wiring layer
26a: second gate wiring layer
26b: second auxiliary wiring layer
B: bonding material
D1: high potential difference clearance
D2: low potential difference clearance
E1: first auxiliary wiring member
E2: second auxiliary wiring member
e: auxiliary wiring member
G1: first gate wiring member
G2: second gate wiring member
g: gate wiring member
I: current
Ia: current
Ib: current
W: wiring member

What is claimed is:

1. A semiconductor module, comprising:
a positive electrode terminal, a negative electrode terminal and an output terminal;
a multilayer substrate including
an insulating plate having a top surface,
a first conductive layer connected to the positive electrode terminal, a second conductive layer connected to the output terminal, and a third conductive layer connected to the negative electrode terminal, which are arranged in a first direction on the top surface of the insulating plate, the first to third conductive layers each having a top surface and a bottom surface opposite to each other, the bottom surface facing the top surface of the insulating plate;
a plurality of first semiconductor elements each having a top surface and a bottom surface opposite to each other, each first semiconductor element having a top electrode on the top surface thereof and a bottom electrode on the bottom surface thereof, said each first semiconductor element being disposed on the top surface of the first conductive layer and being conductively connected to the first conductive layer through the bottom electrode thereof;
a plurality of second semiconductor elements each having a top surface and a bottom surface opposite to each other, each second semiconductor having a top electrode on the top surface thereof and a bottom electrode on the bottom surface thereof, said each second semiconductor element being disposed on the top surface of the second conductive layer and being conductively connected to the second conductive layer through the bottom electrode thereof;
a first main wiring member that connects the top electrode of said each first semiconductor element to the second conductive layer; and
a second main wiring member that connects the top electrode of said each second semiconductor element to the third conductive layer, wherein
the first semiconductor elements and the second semiconductor elements are each arranged in a second direction orthogonal to the first direction, and
the multilayer substrate includes
a first control wiring layer extending in the second direction, and passing under the first main wiring member, and
a second control wiring layer extending in the second direction, and passing under the second main wiring member.

2. The semiconductor module according to claim 1, wherein
each of the first and second semiconductor elements has a gate electrode,
the first control wiring layer includes
a first gate wiring member,
a first auxiliary wiring member,
a first gate wiring layer connected to the gate electrode of one of the first semiconductor elements through the first gate wiring member, and
a first auxiliary wiring layer connected to the top electrode of the one of the first semiconductor elements through the first auxiliary wiring member, and
the second control wiring layer includes
a second auxiliary wiring member,
a second gate wiring member,
a second gate wiring layer connected to the gate electrode of one of the second semiconductor elements through the second gate wiring member, and
a second auxiliary wiring layer connected to the top electrode of the one of the second semiconductor elements through the second auxiliary wiring member.

3. The semiconductor module according to claim 1, wherein
the second conductive layer has a slit extending in the second direction at a side closer to the first control wiring layer than to the second control wiring layer, and
the slit is open at one end and closed at another end opposite to the one end in the second direction.

4. The semiconductor module according to claim 3, wherein
the slit forms a plurality of current pathways through which a current between the plurality of first semiconductor elements and the plurality of second semiconductor elements pass, each current pathway having the same length.

5. The semiconductor module according to claim 3, wherein
the other end of the slit reaches a farthest one of the second semiconductor elements, which is disposed at a position farthest from the one end of the slit among the plurality of second semiconductor elements.

6. The semiconductor module according to claim 3, wherein
the first control wiring layer is disposed between the first and second conductive layers,
the second conductive layer and the first control wiring layer are separated by a gap, and
a width of the slit in the first direction is less than a distance between the second conductive layer and the first control wiring layer defined by the gap.

7. The semiconductor module according to claim 1, wherein
the first conductive layer, the first semiconductor elements, and the first control wiring layer form an upper arm,
the second conductive layer, the second semiconductor elements, and the second control wiring layer form a lower arm, and
the upper arm and the lower arm have a same layout.

8. The semiconductor module according to claim 1, wherein
the insulating plate has a first side and a second side opposite to each other in the second direction,
the positive electrode terminal and the negative electrode terminal are disposed at the first side, and
the output terminal is disposed at the second side.

9. The semiconductor module according to claim 8, wherein
the first control wiring layer has one end closer to the positive electrode than to the output terminal and an other end closer to the output terminal than to the positive electrode,
the plurality of first semiconductor elements include a most outer one that is closer than any one of the rest of the first semiconductor elements to the positive electrode, and a second-most outer one that is closer than any one of the rest of the first semiconductor elements other than the most outer first semiconductor element to the positive electrode,
the one end of the first control wiring layer reaches the second-most outer one of the first semiconductor elements,
the second control wiring layer has one end closer to the negative electrode than to the output terminal and an other end closer to the output terminal than to the negative electrode,
the plurality of the second semiconductor elements include a most outer one that is closer than any one of the rest of the second semiconductor elements to the negative electrode, and a second-most outer one that is closer than any one of the rest of the second semiconductor elements other than the most outer one of the second semiconductor elements to the negative electrode, and
the one end of the second control wiring layer reaches the second-most outer one of the second semiconductor elements.

10. The semiconductor module according to claim 1, further comprising:
a first control terminal connected to the first control wiring layer; and
a second control terminal connected to the second control wiring layer, wherein
the insulating plate has a first side and a second side opposite to each other in the second direction,
the positive electrode terminal and the negative electrode terminal are disposed at the first side, and
the first control terminal and the second control terminal are disposed at the second side.

11. The semiconductor module according to claim 1, wherein
the first main wiring member and the second main wiring member are made of a wire or a metal plate having an arched shape extending in the first direction,
the first main wiring member and the first control wiring layer are disposed so as to intersect each other, and
the second main wiring member and the second control wiring layer are disposed so as to intersect each other.

* * * * *